(12) United States Patent
Oliaei

(10) Patent No.: US 8,515,364 B2
(45) Date of Patent: Aug. 20, 2013

(54) RADIO-FREQUENCY TRANSMITTER AND AMPLIFIER

(75) Inventor: Omid Oliaei, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 663 days.

(21) Appl. No.: 12/719,692

(22) Filed: Mar. 8, 2010

(65) Prior Publication Data

US 2011/0217940 A1  Sep. 8, 2011

(51) Int. Cl.
*H04B 1/04* (2006.01)

(52) U.S. Cl.
CPC ........................................ *H04B 1/04* (2013.01)
USPC .................................... 455/114.1; 455/127.1

(58) Field of Classification Search
CPC ......................................................... H04B 1/04
USPC .............. 455/91, 93, 102, 112, 114.1, 114.2, 455/114.3, 115.1, 126, 127.1, 127.2; 375/295, 375/296
See application file for complete search history.

(56) References Cited

U.S. PATENT DOCUMENTS

| | | | |
|---|---|---|---|
| 6,392,492 B1 | 5/2002 | Yuan | 330/311 |
| 2004/0127173 A1* | 7/2004 | Leizerovich | 455/93 |
| 2008/0144709 A1* | 6/2008 | McCallister et al. | 455/114.3 |
| 2011/0217940 A1* | 9/2011 | Oliaei | 455/127.2 |

OTHER PUBLICATIONS

Lee; "The Design of CMOS Radio-Frequency Intergrated Circuits"; Cambridge University Press; pp. 377-386, 2004.
Fong et al.; "High-Frequency Nonlinearity Analysis of Common-Emitter and Differential-Pair Transconductance Stages"; IEEE Journal of Solid-State Circuits; vol. 33; No. 4; pp. 548-555, 1998.
Tanaka et al.; "A Linearization Technique for CMOS RF Power Amplifiers"; IEEE Symposium on VLSI Circuits; Digest of Technical Papers; pp. 93-94, 1997.
Kim et al.; "A New Linearization Technique for Mosfet RF Amplifier Using Multiple Gated Transistors"; IEEE Microwave and Guided Wave Letters; vol. 10; No, 9; pp. 371-373, 2000.
Webster et al.; "Control of Circuit Distortion by the Derivativfe Superposition Method"; IEEE Microwave and Guided Wave Letters; vol. 6; No. 3; pp. 123-125, 1996.
Aparin et al.; "Modified Derivative Superposition Method for Linearizing FET Low-Noise Amplifiers"; IEEE Transactions on Microwave Theory and Techniques; vol. 53; No. 2; pp. 571-581, 2005.

* cited by examiner

*Primary Examiner* — Thanh Le
(74) *Attorney, Agent, or Firm* — Baker Botts L.L.P.

(57) ABSTRACT

A method is provided for reducing non-linear effects in an electronic circuit including an amplifier. The method may include receiving a modulated signal at an input of the amplifier, the modulated signal comprising a baseband signal modulated by an oscillator frequency. The method may further include substantially attenuating counter-intermodulation in the modulated signal caused by harmonics of the oscillator frequency and the baseband signal by a resonant circuit. In some embodiments, the resonant circuit may include at least one inductive element and one capacitive element coupled to the at least one inductive element, the at least one inductive element and the at least one capacitive element configured to substantially attenuate counter-intermodulation in the modulated signal.

22 Claims, 1 Drawing Sheet

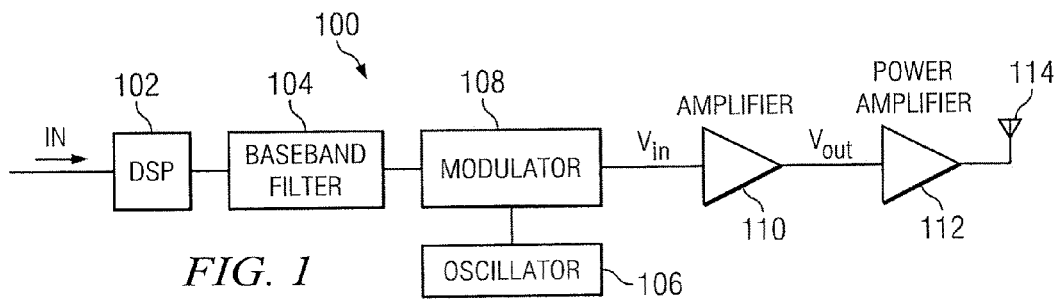
FIG. 1
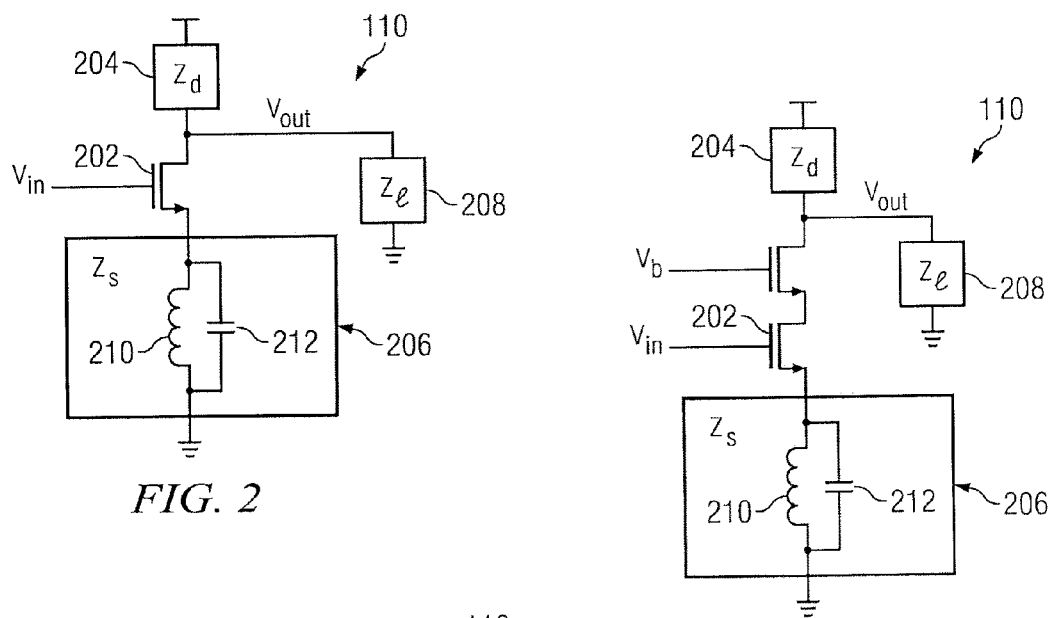
FIG. 2
FIG. 3
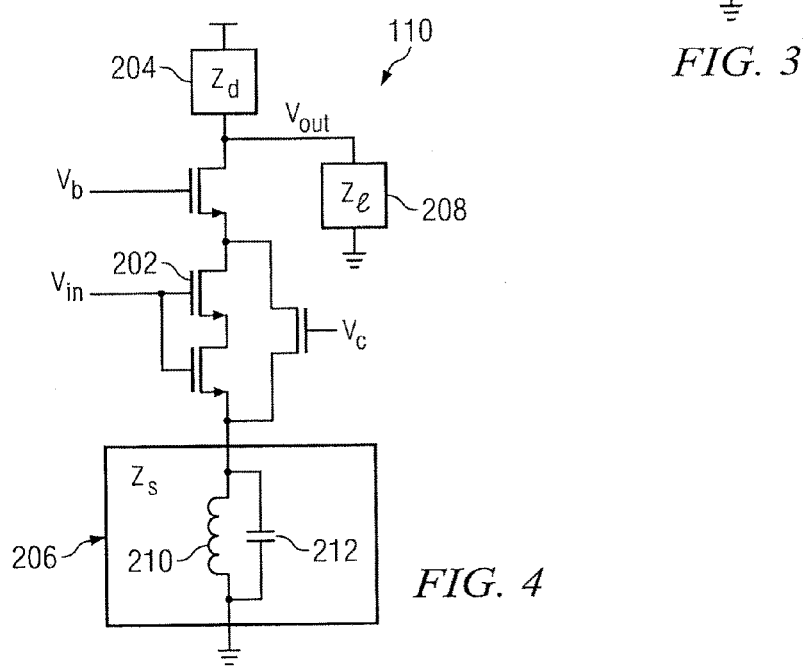
FIG. 4

RADIO-FREQUENCY TRANSMITTER AND AMPLIFIER

TECHNICAL FIELD OF THE INVENTION

The present invention relates generally to radio-frequency communication and, more particularly, to a radio-frequency transmitter and amplifier.

BACKGROUND

Radio communications systems are used in a variety of telecommunications systems, television, radio and other media systems, data communication networks, and other systems to convey information between remote points using radio-frequency transmitters. To communicate such information, radio communications systems employ radio transmitters. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal.

A common problem in radio transmitters, radio-frequency amplifiers, and other electronic devices is non-linearity of signal gain. Non-linearity may cause amplifier gain to be dependent upon input signal amplitude and as a result may cause harmonic distortion and other undesired effects. Of particular concern is third-order non-linearity which is in many cases the dominant type of non-linearity, resulting in a phenomenon known as third-order intermodulation. In a radio transmitter, harmonics may be introduced from both a baseband signal and a local oscillator used to modulate the baseband signal. Such harmonics can impact the performance of a transmitter in at least two ways, both of which can generate signal components outside of an allowed spectral mask, and thereby, may cause spectral interference to other devices.

The first mechanism is the intermodulation between harmonics of the local oscillator and baseband signals, know as counter-intermodulation. The second mechanism is the harmonic distortion of an upconverted radio-frequency signal by the radio-frequency amplifier of the transmitter. Modulators may be designed to reduce counter-intermodulation. However, non-linearties in radio-frequency amplifiers may cause regeneration of the counter-intermodulation.

Traditional approaches to solving the above problems have disadvantages. For example, a technique known as inductive degeneration is often applied in radio-frequency circuits to improve circuit linearity. However, this technique does not address the problem of counter intermodulation. As another example, a technique known as derivative superposition may be used to cancel third-order non-linearity. However, derivative superposition is not effective in reducing counter-intermodulation regeneration. As a further example, an output of the modulator of a transmitter may be high-pass filtered to reduce counter-intermodulation, but such approach does not eliminate non-linearities of the amplifier which may regenerate the counter-intermodulation.

SUMMARY

In accordance with a particular embodiment of the present disclosure, a method is provided for reducing non-linear effects in an electronic circuit including an amplifier. The method may include receiving a modulated signal at an input of the amplifier, the modulated signal comprising a baseband signal modulated by an oscillator frequency. The method may further include substantially attenuating counter-intermodulation in the modulated signal caused by harmonics of the oscillator frequency and the baseband signal by a resonant circuit. In some embodiments, the resonant circuit may include at least one inductive element and one capacitive element coupled to the at least one inductive element, the at least one inductive element and the at least one capacitive element configured to substantially attenuate counter-intermodulation in the modulated signal.

Technical advantages of one or more embodiments of the present invention may include reducing counter-intermodulation caused by harmonics of a baseband signal and an oscillator.

It will be understood that the various embodiments of the present invention may include some, all, or none of the enumerated technical advantages. In addition, other technical advantages of the present invention may be readily apparent to one skilled in the art from the figures, description and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 1 illustrates a block diagram of an example radio transmitter, in accordance with certain embodiments of the present disclosure;

FIG. 2 illustrates a block diagram of an example amplifier for use in a radio transmitter, in accordance with certain embodiments of the present disclosure;

FIG. 3 illustrates a block diagram of another example amplifier for use in a radio transmitter, in accordance with certain embodiments of the present disclosure; and FIG. 4 illustrates a block diagram of yet another example amplifier for use in a radio transmitter, in accordance with certain embodiments of the present disclosure.

DETAILED DESCRIPTION

FIG. 1 illustrates a block diagram of an example radio transmitter 100, in accordance with certain embodiments of the present disclosure. As shown in FIG. 1, radio transmitter 100 may include a digital signal processor (DSP) 102, a baseband filter 104 coupled to DSP 102, an oscillator 106, a modulator 108 coupled to baseband filter 104 and oscillator 106, an amplifier 110 coupled to modulator 108, a power amplifier 112 coupled to amplifier 110, and an antenna 114 coupled to power amplifier 112. DSP 102 may include a microprocessor-like circuit configured to processes digital signals input to DSP 102 using numerous techniques including filtering, transforms, and others. For example, DSP 102 may process and/or transform signals to make such signals suitable for modulation and transmission by radio transmitter 100. DSP 102 may output an analog signal to baseband filter 104.

Baseband filter 104 may be coupled to the output of DSP 102 and may be any suitable device, system, or apparatus configured to pass signal frequencies from approximately 0 Hz to a maximum frequency, to produce a baseband signal. In radio transmitter 100, baseband filter 104 may filter the output of an analog signal produced by DSP 102 to produce a baseband signal for modulation and transmission by radio transmitter 100.

Oscillator 106 may be any suitable device, system, or apparatus configured to produce an analog waveform of a particular frequency for modulation of the baseband signal produced by baseband filter 104. In embodiments in which radio transmitter 100 is a fixed-frequency transmitter, oscillator 106 may comprise a resonant quartz crystal or other device tuned for a desired frequency. In embodiments in which radio transmitter 100 is a variable-frequency transmitter, oscillator 106 may comprise a variable-frequency oscillator, phase-locked loop frequency synthesizer, or other device configured to produce a variable frequency.

Modulator 108 may be coupled to the outputs of baseband filter 104 and may be any suitable device, system, or apparatus configured to modulate a baseband signal produced by baseband filter 104 at the frequency of a waveform produced by oscillator 106 in order to produce a modulated signal. In certain embodiments, modulator 108 may comprise an IQ modulator that may produce a modulated output signal based on an inphase electrical carrier signal and a quadrature electrical carrier signal, as is known in the art.

Amplifier 110 may be coupled to the output of modulator 108 and may be any suitable device, system, or apparatus configured to receive an input signal (e.g., current or voltage) and amplify the input signal by a gain to produce an output signal that is a multiple of the input signal. In certain embodiments, amplifier 110 may include a non-inverting amplifier, an inverting amplifier, or any combination thereof. Example embodiments of amplifier 110 are discussed in greater detail below with respect to FIGS. 2-4.

Power amplifier 112 may be coupled to the output of amplifier 110 and may be any suitable device, system, or apparatus configured to receive an input signal (e.g., current or voltage) and amplify the input signal by a gain to produce a signal with high power at its output relative to its input signal for transmission via antenna 114. In certain embodiments, power amplifier 112 may include a non-inverting amplifier, an inverting amplifier, or any combination thereof.

Antenna 114 may be coupled to the output of power amplifier 112 and may be any suitable device, system, or apparatus configured to convert electrical currents into electromagnetic waves and transmit such electromagnetic waves.

Although FIG. 1 is shown as only having one amplifier 110, some embodiments of radio transmitter 100 may include multiple amplifiers (e.g. multiple amplifiers arranged in a parallel configuration).

FIG. 2 illustrates a block diagram of an example amplifier 110 for use in a radio transmitter (e.g., radio transmitter 100), in accordance with certain embodiments of the present disclosure. As shown in FIG. 2, amplifier 110 may include a transistor 202, a first impedance 204 coupled to a first terminal of transistor 202, a resonant degeneration impedance 206 coupled to a second terminal of transistor 202, and a load impedance 208 coupled to the first terminal of transistor 202 and first impedance 204.

Transistor 202 may be any device having at least three terminals for connection to a circuit external to transistor 202, such that a voltage or current applied to at least one of transistor 202's terminals may control the magnitude of current flowing through at least one other terminal. Although FIG. 2 depicts transistor 202 as a n-type field effect transistor, transistor 202 may comprise any suitable type of transistor, including without limitation a p-type field effect transistor, a bipolar junction transistor, insulated gate bipolar transistor, or any other type of transistor. The type of transistor used for transistor 202, as well as the physical characteristics of transistor 202 (e.g., the current gain, voltage gain, transresistance, or transconductance of transistor 202) may be selected based on desired characteristics for amplifier 110 (e.g., desired gain) and/or radio transmitter 100 (e.g., desired transmission frequency).

First impedance 204 may be coupled between a first terminal of transistor 202 and a signal supply voltage and may include any combination of passive circuit elements (e.g., resistors, capacitors, and inductors) selected based on desired characteristics for amplifier 110 (e.g., desired gain) and/or radio transmitter 100 (e.g., desired transmission frequency). Although first impedance 204 is shown as being coupled to the drain of transistor 202 in FIG. 2, the first terminal to which first impedance 204 is coupled may be determined based on the type of transistor used (e.g., first impedance may be coupled to a source terminal of a p-type field effect transistor, or an emitter or collector terminal of a bipolar junction transistor). In addition, in other embodiments first impedance 204 may be coupled between a terminal of transistor 202 and signal ground.

Resonant degeneration impedance 206 may be coupled between a second terminal of transistor 202 and signal ground and may include any combination of at least one inductive circuit element 210 and at least one capacitive circuit element 212 selected to have a resonant frequency such that a particular nth-order counter-modulation is not generated by amplifier 110. For example, in certain embodiments, inductive circuit element 210 and capacitive circuit element 212 may be configured in parallel (as shown in FIG. 2) and may have a resonant frequency approximately equal to three times the frequency of oscillator 106, thereby substantially preventing generation of 3rd-order counter-intermodulation. As another example, in other embodiments, inductive circuit element 210 and capacitive circuit element 212 may be configured in parallel (as shown in FIG. 2) and may have a resonant frequency approximately equal to five times the frequency of oscillator 106, thereby substantially preventing generation of 5th-order counter-intermodulation. In some embodiments, resonant degeneration impedance 206 may have multiple resonant frequencies (e.g., both three times the frequency of oscillator 106 and five times the frequency of oscillator 106). Although resonant degeneration impedance 206 is shown as being coupled to the source of transistor 202 in FIG. 2, the second terminal to which resonant degeneration impedance 206 is coupled may be determined based on the type of transistor used (e.g., resonant degeneration impedance may be coupled to a drain terminal of a p-type field effect transistor, or an emitter or collector terminal of a bipolar junction transistor). In addition, in other embodiments resonant degeneration impedance 206 may be coupled between a terminal of transistor 202 and a signal supply voltage.

Load impedance 208 may be coupled to the first terminal and may include any combination of passive circuit elements (e.g., resistors, capacitors, and inductors) selected based on desired characteristics for amplifier 110 (e.g., desired gain, impedance matching) and/or radio transmitter 100 (e.g., desired transmission frequency). In certain embodiments, load impedance 208 may not be a part of amplifier 110, but may instead serve to model an output impedance seen at the first terminal of transistor 202 (e.g., an input impedance of power amplifier 112 or other component coupled to the output of amplifier 110).

It is understood that FIG. 2 may depict only a subset of the elements and components of amplifier 110 for the purposes of clarity and exposition. Accordingly, amplifier 110 may include elements and components other than those shown in FIG. 2 (e.g., components for input or output impedance matching, direct current biasing components, and other components).

In addition, resonant degeneration impedance 206 may be used in multiple embodiments of amplifier 110, such as the embodiments shown in FIGS. 3 and 4, for example. FIG. 3 illustrates a block diagram of an embodiment of amplifier 110 (with resonant degeneration impedance 206) in a cascode configuration. FIG. 4 illustrates a block diagram of a embodiment of amplifier 110 (with resonant degeneration impedance 206) utilizing derivative superposition. Embodiments other than those depicted in FIGS. 2-4 may also be utilized.

Modifications, additions, or omissions may be made to radio transmitter 100 and/or amplifier 110 from the scope of the disclosure. The components of optical networks radio transmitter 100 and/or amplifier 110 may be integrated or separated. Moreover, the operations of optical networks radio transmitter 100 and/or amplifier 110 may be performed by more, fewer, or other components. As used in this document, "each" refers to each member of a set or each member of a subset of a set.

Although the present invention has been described with several embodiments, various changes and modifications may be suggested to one skilled in the art. It is intended that the present invention encompass such changes and modifications as fall within the scope of the appended claims.

What is claimed is:

1. A radio transmitter, comprising:
    a modulator configured to modulate a baseband signal at an oscillator frequency to produce a modulated signal; and
    an amplifier coupled to the modulator and configured to:
        amplify the modulated signal; and
        substantially attenuate counter-intermodulation in the modulated signal caused by harmonics of the oscillator frequency and the baseband signal.

2. A radio transmitter according to claim 1, the amplifier further configured to substantially attenuate counter-intermodulation occurring at a frequency approximately equal to three times the oscillator frequency.

3. A radio transmitter according to claim 1, the amplifier further configured to substantially attenuate counter-intermodulation occurring at a frequency approximately equal to five times the oscillator frequency.

4. A radio transmitter according to claim 1, the amplifier including a resonant circuit configured to have a resonant frequency approximately equal to a multiple of the oscillator frequency.

5. A radio transmitter according to claim 4, the resonant frequency approximately equal to one of: three times the oscillator frequency and five times the oscillator frequency.

6. A radio transmitter according to claim 1, the amplifier including a resonant circuit configured to have a first resonant frequency equal to a first multiple of the oscillator frequency and a second resonant frequency equal to a second multiple of the oscillator frequency.

7. A radio transmitter according to claim 1, the amplifier further comprising a cascode amplifier.

8. A radio transmitter according to claim 1, the amplifier further configured to perform derivative superposition.

9. An amplifier, comprising:
    a transistor having at least three terminals; and
    a resonant circuit coupled to a first terminal of the at least three terminals, the resonant circuit having at least one inductive element and one capacitive element coupled to the at least one inductive element, the at least one inductive element and the at least one capacitive element configured to substantially attenuate counter-intermodulation in a modulated signal received at a second terminal of the at least three terminals.

10. An amplifier in accordance with claim 9, wherein the modulated signal is modulated at an oscillator frequency, and wherein the at least one inductive element and the at least one capacitive element are configured to have a resonant frequency approximately equal to a multiple of the oscillator frequency.

11. An amplifier according to claim 10, the resonant frequency approximately equal to one of: three times the oscillator frequency and five times the oscillator frequency.

12. An amplifier in accordance with claim 9, wherein the modulated signal is modulated at an oscillator frequency, and wherein the at least one inductive element and the at least one capacitive element are configured to have a first resonant frequency approximately equal to a first multiple of the oscillator frequency and a second resonant frequency approximately equal to a second multiple of the oscillator.

13. An amplifier according to claim 9, further comprising a second transistor in cascode orientation with respect to the transistor.

14. An amplifier according to claim 9, the amplifier further comprising one or more components configured to perform derivative superposition.

15. An amplifier according to claim 9, wherein the at least one inductive element and the at least one capacitive element are configured in parallel.

16. An amplifier according to claim 9, wherein the resonant circuit is coupled between the first terminal and a signal ground of the amplifier.

17. An amplifier according to claim 9, wherein the transistor comprises a bipolar junction transistor, and the resonant circuit is coupled to one of: a collector terminal of the transistor and an emitter terminal of the transistor.

18. An amplifier according to claim 9, wherein the transistor comprises a field-effect transistor, and the resonant circuit is coupled to one of: a drain terminal of the transistor and an drain terminal of the transistor.

19. A method for reducing non-linear effects in an electronic circuit including an amplifier, comprising:
    receiving a modulated signal at an input of the amplifier, the modulated signal comprising a baseband signal modulated by an oscillator frequency; and
    using an amplifier, amplifying the modulated signal and substantially attenuating counter-intermodulation in the modulated signal caused by harmonics of the oscillator frequency and the baseband signal using a resonant circuit of the amplifier.

20. A method according to claim 19, wherein substantially attenuating counter intermodulation comprises substantially attenuating counter-intermodulation occurring at a frequency approximately equal to a multiple of the oscillator frequency.

21. A method according to claim 19, wherein substantially attenuating counter-intermodulation comprises substantially attenuating counter-intermodulation occurring at a frequency approximately equal to one of: three times the oscillator frequency and five times the oscillator frequency.

22. A method according to claim 19, wherein the resonant circuit comprises at least one inductive element and one capacitive element coupled to the at least one inductive element, the at least one inductive element and the at least one capacitive element configured to substantially attenuate counter-intermodulation in the modulated signal.

* * * * *